United States Patent
George et al.

(10) Patent No.: US 9,583,374 B2
(45) Date of Patent: Feb. 28, 2017

(54) DEBONDING TEMPORARILY BONDED SEMICONDUCTOR WAFERS

(71) Applicant: SUSS MicroTec Lithography GmbH, Garching (DE)

(72) Inventors: Gregory George, Colchester, VT (US); Christopher Rosenthal, San Jose, CA (US)

(73) Assignee: SUSS MicroTec Lithography GmbH (DE)

( * ) Notice: Subject to any disclaimer, the term of this patent is extended or adjusted under 35 U.S.C. 154(b) by 0 days.

(21) Appl. No.: 15/188,189

(22) Filed: Jun. 21, 2016

(65) Prior Publication Data

US 2016/0300747 A1    Oct. 13, 2016

Related U.S. Application Data

(60) Division of application No. 14/577,369, filed on Dec. 19, 2014, which is a continuation of application No.
(Continued)

(51) Int. Cl.
*B32B 38/10* (2006.01)
*H01L 21/683* (2006.01)
(Continued)

(52) U.S. Cl.
CPC .......... *H01L 21/6835* (2013.01); *B32B 38/10* (2013.01); *B32B 38/1858* (2013.01);
(Continued)

(58) Field of Classification Search
CPC . B32B 38/10; B32B 43/006; Y10T 156/1967; Y10T 156/1978; Y10T 156/1142; Y10T 156/1168
(Continued)

(56) References Cited

U.S. PATENT DOCUMENTS 789,005 A    5/1905    Conkey et al.
2,559,434 A    7/1951    Hyland
(Continued)

FOREIGN PATENT DOCUMENTS

CN    1910035 A    2/2007
DE    102006031434 A1    1/2008
(Continued)

OTHER PUBLICATIONS

Bagdahn, J. et al, "A new Approach for Handling and Transferring of Thin Semiconductor Materials", Microsystem Technologies, vol. 9, 2003, pp. 204-209.
(Continued)

*Primary Examiner* — Mark A Osele
*Assistant Examiner* — Nickolas Harm
(74) *Attorney, Agent, or Firm* — Hayes Soloway PC

(57) ABSTRACT

Described methods and apparatus provide a controlled perturbation to an adhesive bond between a device wafer and a carrier wafer. The controlled perturbation, which can be mechanical, chemical, thermal, or radiative, facilitates the separation of the two wafers without damaging the device wafer. The controlled perturbation initiates a crack either within the adhesive joining the two wafers, at an interface within the adhesive layer (such as between a release layer and the adhesive), or at a wafer/adhesive interface. The crack can then be propagated using any of the foregoing methods, or combinations thereof, used to initiate the crack.

18 Claims, 6 Drawing Sheets

Related U.S. Application Data

13/662,307, filed on Oct. 26, 2012, now Pat. No. 8,950,459, which is a continuation-in-part of application No. 13/085,159, filed on Apr. 12, 2011, now Pat. No. 8,366,873, and a continuation-in-part of application No. 12/761,014, filed on Apr. 15, 2010, now Pat. No. 8,267,143, said application No. 13/085,159 is a continuation-in-part of application No. 12/761,014, filed on Apr. 15, 2010, now Pat. No. 8,267,143.

(60) Provisional application No. 61/552,140, filed on Oct. 27, 2011, provisional application No. 61/169,753, filed on Apr. 16, 2009, provisional application No. 61/324,888, filed on Apr. 16, 2010.

(51) Int. Cl.
| | | |
|---|---|---|
| *H01L 21/67* | (2006.01) | |
| *B32B 43/00* | (2006.01) | |
| *B32B 38/18* | (2006.01) | |

(52) U.S. Cl.
CPC ...... *B32B 43/006* (2013.01); *H01L 21/67092* (2013.01); *H01L 21/6838* (2013.01); *B32B 2457/14* (2013.01); *H01L 2221/6834* (2013.01); *H01L 2221/6839* (2013.01); *H01L 2221/68327* (2013.01); *H01L 2221/68381* (2013.01); *Y10T 156/1142* (2015.01); *Y10T 156/1168* (2015.01); *Y10T 156/1967* (2015.01); *Y10T 156/1978* (2015.01)

(58) Field of Classification Search
USPC .................. 156/709, 714, 717, 762, 764
See application file for complete search history.

(56) References Cited

U.S. PATENT DOCUMENTS

| | | | |
|---|---|---|---|
| 4,046,985 A | 9/1977 | Gates | |
| 4,096,777 A | 6/1978 | Adams | |
| 4,273,016 A | 6/1981 | Murdock | |
| 4,608,898 A | 9/1986 | Volk | |
| 4,685,369 A | 8/1987 | Beamer | |
| 4,718,413 A | 1/1988 | Johnson | |
| 4,889,329 A | 12/1989 | Smith, Jr. | |
| 5,699,711 A | 12/1997 | Gold | |
| 5,783,022 A | 7/1998 | Cha et al. | |
| 5,863,375 A | 1/1999 | Cha et al. | |
| 6,140,209 A | 10/2000 | Iwane et al. | |
| 6,221,740 B1 | 4/2001 | Bryan et al. | |
| 6,554,046 B1 | 4/2003 | Bryan et al. | |
| 6,789,595 B2 | 9/2004 | Hayafuji et al. | |
| 6,792,991 B2 | 9/2004 | Thallner | |
| 6,971,428 B2 | 12/2005 | Eichlseder | |
| 7,150,804 B2 | 12/2006 | Tajima | |
| 7,367,773 B2 | 5/2008 | Buitron et al. | |
| 8,038,839 B2 | 10/2011 | Noda et al. | |
| 8,551,291 B2 | 10/2013 | George | |
| 8,950,307 B1 | 2/2015 | Harlos et al. | |
| 2002/0088556 A1 | 7/2002 | De et al. | |
| 2002/0174958 A1 | 11/2002 | Yanagita et al. | |
| 2003/0000635 A1 | 1/2003 | Anker | |
| 2003/0015286 A1 | 1/2003 | De et al. | |
| 2003/0089455 A1 | 5/2003 | Sakaguchi et al. | |
| 2003/0170424 A1 | 9/2003 | Roberds et al. | |
| 2003/0173035 A1 | 9/2003 | Yamaguchi | |
| 2004/0166653 A1* | 8/2004 | Kerdiles | G01N 19/04 438/458 |
| 2005/0000649 A1 | 1/2005 | Rayssac et al. | |
| 2005/0112847 A1 | 5/2005 | Moriceau et al. | |
| 2005/0150597 A1 | 7/2005 | Henley et al. | |
| 2006/0264004 A1 | 11/2006 | Tong et al. | |
| 2006/0289085 A1 | 12/2006 | Betts | |
| 2006/0289992 A1 | 12/2006 | Wood | |
| 2007/0119893 A1 | 5/2007 | Rayssac et al. | |
| 2008/0008565 A1 | 1/2008 | Thallner | |
| 2008/0020573 A1 | 1/2008 | Birkmeyer et al. | |
| 2008/0090380 A1 | 4/2008 | Gardner et al. | |
| 2008/0200011 A1 | 8/2008 | Pillalamarri et al. | |
| 2008/0271845 A1 | 11/2008 | Keite-Telgenbuscher et al. | |
| 2008/0302481 A1 | 12/2008 | Berger et al. | |
| 2008/0305721 A1 | 12/2008 | Ohashi | |
| 2009/0038750 A1 | 2/2009 | Hong et al. | |
| 2009/0057801 A1 | 3/2009 | Goushcha et al. | |
| 2009/0165277 A1 | 7/2009 | Zussy et al. | |
| 2009/0174018 A1 | 7/2009 | Dungan et al. | |
| 2009/0218560 A1 | 9/2009 | Flaim et al. | |
| 2009/0258583 A1 | 10/2009 | Thallner | |
| 2009/0280602 A1 | 11/2009 | Bonifield et al. | |
| 2010/0112782 A1 | 5/2010 | Teixeira | |
| 2010/0263794 A1 | 10/2010 | George et al. | |
| 2011/0010908 A1 | 1/2011 | George et al. | |
| 2011/0014774 A1 | 1/2011 | Johnson et al. | |
| 2011/0136321 A1 | 6/2011 | Kuroda et al. | |
| 2011/0146917 A1* | 6/2011 | Iwamoto | B32B 43/006 156/711 |
| 2011/0198040 A1* | 8/2011 | Ebata | B65H 41/00 156/750 |
| 2011/0253314 A1 | 10/2011 | George | |
| 2012/0168091 A1 | 7/2012 | Kell et al. | |
| 2012/0247685 A1 | 10/2012 | Burrows et al. | |

FOREIGN PATENT DOCUMENTS

| | | |
|---|---|---|
| DE | 102008018536 A1 | 10/2009 |
| EP | 0101734 A1 | 3/1984 |
| EP | 2230683 A1 | 9/2010 |
| FR | 2148947 | 3/1973 |
| FR | 2975616 | 11/2012 |
| JP | 2002075915 A | 3/2002 |
| JP | 2003197724 A | 7/2003 |
| JP | 2005514241 A | 5/2005 |
| JP | 2006032506 A | 2/2006 |
| JP | 2007526628 A | 9/2007 |
| JP | 2008517780 A | 5/2008 |
| JP | 2008306120 A | 12/2008 |
| JP | 4757444 B | 6/2011 |
| JP | 2011146457 A | 7/2011 |
| JP | 2012004522 A | 1/2012 |
| KR | 1020050004904 A | 1/2005 |
| KR | 1020050033440 A | 4/2005 |
| KR | 1020060028439 A | 3/2006 |
| KR | 1020060031701 A | 4/2006 |
| WO | 2006008538 A1 | 1/2006 |
| WO | 2008045669 A1 | 4/2008 |
| WO | 2009094558 A2 | 7/2009 |
| WO | 2009153602 A1 | 12/2009 |
| WO | 2011026570 A1 | 3/2011 |

OTHER PUBLICATIONS

Spiering, Vincent L. et al, "Sacrificial Wafer Bonding for Planarization after Very Deep Etching", Journal of Microelectromechanical Systems, vol. 4, No. 3, Sep. 1995, pp. 151-157.

Kharas, Dave and Nagul Sooriar, "Cycle Time and Cost Reduction Benefits of an Automated Bonder and Debonder System for a High Volume 150 mm GaAs HBT Back-end Process Flow", CS Mantech Conference, May 18-21, 2009, Tampa, FL, USA.

Privett, Mark, Franz Murauer, Jurgen Burggraf, Stefan Pargfrieder, and Chad Brubaker, "TSV Thinned Wafer Debonding Process Optimization", IWLPC (Wafer-Level Packaging) Conference Proceedings, Oct. 13, 2008.

EV Group "Temporary Bonding/Debonding Systems" EVG 850TB/DB, http:www.evgroup.com/documents/brochures/evg850_tb_db_shortbrochure.pdf.

Rama Puligadda et al, "High-Performance Temporary Adhesives for Wafer Bonding Applications", Materials Research Society 2006 Fall Symposium, http://www.mrs.org/s_mrs/sec_subscribe.asp?CID=7391&DID=190818&action=detail.

(56) References Cited

OTHER PUBLICATIONS

Vorrada Loryuenyong et al: "Photo-Polymer Wafer Bonding for Double Layer Transfer", Materials Research Society 2003, Spring Symposium, http://mrs.org/s_mrs/sec_subscribe.asp?CID-2596 &DID=110037&action=detail.
Pargfrieder et al, "Ultrathin Wafer Processing Using Temporary Bonding"; Semiconductor International; Mar. 1, 2006, www.semiconductor.net/article/print/207503-Ultrathin_Wafer_Processing_Using_Temporary_Bonding.php.
Mould, David J. and John C. Moore, "A New Alternative for Temporary Wafer Mounting", GaAsMantech Conference, 2002.

\* cited by examiner

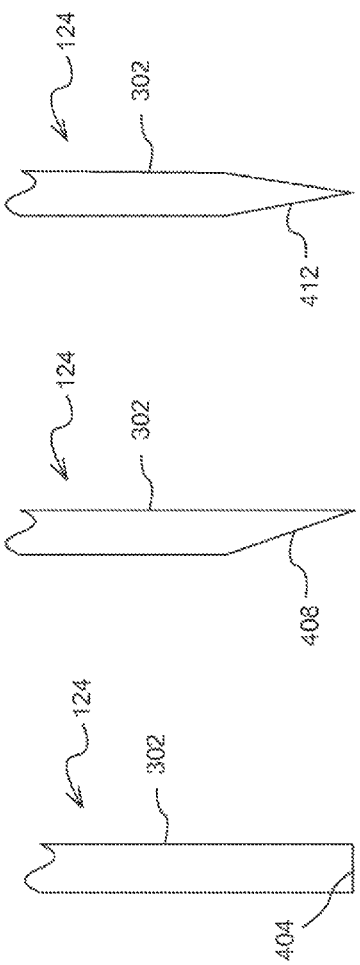
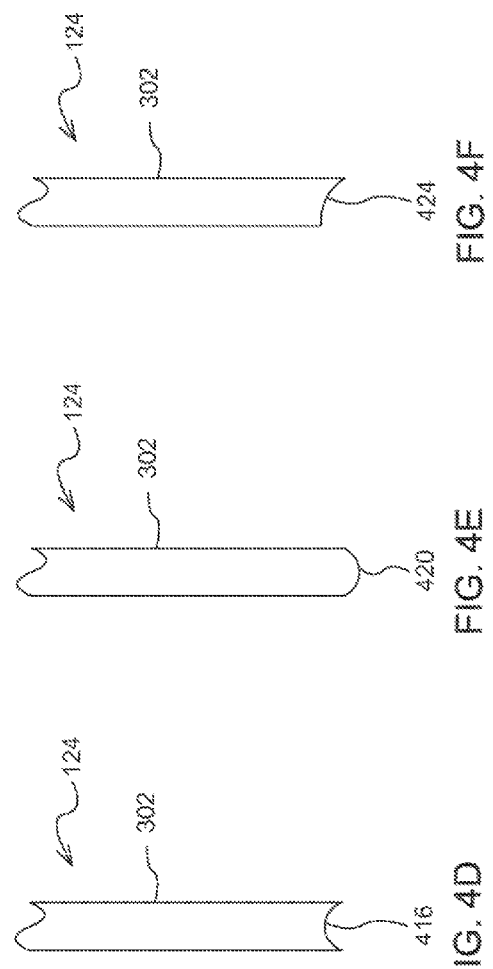

DEBONDING TEMPORARILY BONDED SEMICONDUCTOR WAFERS

CROSS REFERENCE TO RELATED APPLICATIONS

This application is a divisional of U.S. patent application Ser. No. 14/577,369, filed on Dec. 19, 2014 which is a continuation of U.S. patent application Ser. No. 13/662,307, filed on Oct. 26, 2012, now U.S. Pat. No. 8,950,459, which claims the benefit of provisional application 61/552,140 filed on Oct. 27, 2011. U.S. patent application Ser. No. 13/662,307 is a continuation-in-part of U.S. application Ser. No. 13/085,159 "Debonding equipment and methods for debonding temporary bonded wafers," filed Apr. 12, 2011 by Gregory George, now U.S. Pat. No. 8,366,873 and a continuation-in-part of U.S. application Ser. No. 12/761,014, "Debonding equipment and methods for debonding temporary bonded wafers," filed Apr. 15, 2010 by Gregory George et al., now U.S. Pat. No. 8,267,143. U.S. application Ser. No. 12/761,014 claims the benefit of provisional application 61/169,753 filed on Apr. 16, 2009. U.S. patent application Ser. No. 13/085,159 is a continuation in part of U.S. patent application Ser. No. 12/761,014 filed on Apr. 15, 2010, now U.S. Pat. No. 8,267,143 and also claims priority to U.S. Provisional Application No. 61/324,888, filed Apr. 16, 2010. All of the foregoing are incorporated by reference in their entireties.

BACKGROUND

Embodiments of the present disclosure relate generally to improved debonding equipment and methods, and more particularly to debonding temporarily bonded wafers.

Several semiconductor wafer processes include wafer thinning steps. In some applications the wafers are thinned for the fabrication of integrated circuit (IC) devices. Thin wafers have the advantages of improved heat removal and better electrical operation of the fabricated IC devices. Wafer thinning also contributes to a reduction of the device capacitance and to an increase of its impedance, both of which result in an overall size reduction of the fabricated device. In other applications, wafer thinning is used for 3D-integration bonding and for fabricating through wafer vias.

Wafer thinning is usually performed via back-grinding and/or chemical mechanical polishing (CMP) of a wafer. CMP involves bringing the wafer surface into contact with a hard and flat rotating horizontal platen in the presence of liquid slurry. The slurry usually contains abrasive powders, such as diamond or silicon carbide, along with chemical etchants such as ammonia, fluoride, or combinations thereof. Polishing the wafer with the platen using the abrasive slurry thins the wafer, while the etchants polish the surface at the submicron level. The wafer is polished until a certain amount of substrate has been removed to achieve a targeted thickness.

For wafer thicknesses greater than 200 .mu.m, the wafer is usually held in place with a fixture that utilizes a vacuum chuck or some other means of mechanical attachment. However, for wafer thicknesses of less than 200 .mu.m and especially for wafer thicknesses of less than 100 .mu.m, it becomes increasingly difficult to mechanically hold the wafer and also maintain control of the planarity and integrity of the wafer during thinning. In these cases, it is not uncommon for wafers to develop microfractures and break during CMP.

An alternative to directly holding a wafer during thinning involves attaching the device wafer (i.e., the processed wafer) to a carrier wafer for support and then thinning down the exposed opposite surface of the device wafer. The bond between the carrier wafer and the device wafer is temporary and the wafers are separated upon completion of the thinning (or other processing steps).

SUMMARY

Embodiments of the present disclosure include methods and apparatus for providing a controlled perturbation to an adhesive bond between a device wafer and a carrier wafer. This controlled perturbation facilitates the separation of the two wafers without damaging (or reducing the damage to) the device wafer. This controlled perturbation, which can be mechanical, chemical, thermal, radiative, or combinations thereof, within the adhesive joining the two wafers, at an interface within the adhesive layer (such as between a release layer and the adhesive), or at a wafer/adhesive interface. The crack can then be propagated by performing a controlled debonding of the carrier wafer from the device wafer while leaving the device wafer intact and undamaged.

BRIEF DESCRIPTION OF THE DRAWINGS

FIGS. 4A-4F are side views of additional examples of tip configurations of a crack initiator, in an embodiment.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

Overview

Figure 1A:
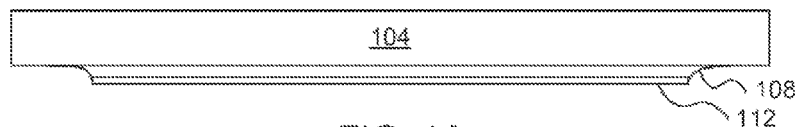
FIG. 1A is a cross-sectional view of a carrier wafer temporarily bonded to a device wafer, in an embodiment.

FIG. 1A is a cross-sectional view of a device wafer 112 temporarily bonded to a carrier wafer 104 by an adhesive layer 108. Embodiments of the present disclosure can be used to initiate and propagate a crack in the adhesive layer 108, and preferably at an interface of the adhesive layer 108 with either the device wafer 112 or the carrier wafer 104, thereby debonding the two wafers.

Examples of device wafer 112 include silicon wafers, GaAs, GaN wafers, or any other semiconductor wafer, especially those that are thinned are to be thinned to less than 100 .mu.m as part of processing. In other examples, embodiments of the present disclosure can be used to de-bond even thinner and less mechanically robust device wafers 112. Particularly for a device wafer 112 have a thickness of less than 100 .mu.m, embodiments of the present disclosure can initiate a crack at a wafer interface with the adhesive layer 108 (either the device wafer 112/adhesive layer 108 interface or the carrier wafer 104/adhesive layer 108 interface), and successfully separate the device wafer from the carrier wafer 104 without damaging the device wafer, unlike conventional separation techniques. As wafers get thinner, it is beneficial to initiate a crack between the two bonded wafers in a controlled way and execute a controlled propagation of the crack, thereby separating the wafers in a controlled manner so as to prevent damage to the device wafer.

In various applications, the device wafer can be as thin as 50 .mu.m or even as thin as 10 .mu.m. The device wafer 112 typically has a diameter ranging from 50 mm to 200 mm to 300 mm or larger.

The carrier wafer 104 is usually made of a non-contaminating material that is thermally matched (i.e., having approximately the same coefficient of thermal expansion) to the device wafer 112. Examples of carrier wafer materials include silicon, glass, sapphire, quartz or other convenient substrate materials having mechanical and thermal properties similar to the device wafer. Preferably, the carrier wafer 104 is thicker or is otherwise more mechanically robust than the device wafer. The carrier wafer 104 then provides mechanical support or added mechanical robustness to the more fragile (and typically more valuable) device wafer. Providing additional mechanical robustness to the device wafer is beneficial because, in later stages of semiconductor processing when carrier wafers are often used, the device wafer includes semiconductor devices that have been partially or completely fabricated. These device wafers represent a significant financial investment on the part of the manufacturer. Reducing device wafer damage and/or breakage reduces financial loss.

The adhesive layer 108 is an adhesive that is used to join the carrier wafer 104 to the device wafer 112. The adhesive layer 108 can be formed by using any number of adhesive, polymeric, and/or oligomeric systems including silicones, polyimides, acrylates and a variety of thermoplastics. Some systems used for the adhesive layer 108 include multiple layers, which can perform functions beyond just bonding the two wafers. In some examples, in addition to an adhesive, the adhesive layer 108 includes a release layer that is adjacent to one of the wafers 104 or 112 that facilitates separation of the adhesive from a wafer. In other examples, the adhesive layer 108 includes a primer layer adjacent to one of the wafers 104 or 112 that improves the adhesion between the adhesive and the wafer. In still other examples, the adhesive layer 108 include both of these types of layers, or multiple layers of adhesives having different mechanical (e.g., modulus, fracture toughness, glass transition temperature), thermal, or chemical properties. Using multiple layers of different adhesives, primers, and/or release layers can tailor the properties of the adhesive layer 108, thereby facilitating the controlled separation of the wafers 104 and 112 from each other regardless of the particular geometries and mechanical properties of the wafers.

The thickness of the adhesive layer 108 is generally a function of the particular adhesive system applied to the wafer, the amount applied (as influenced by the mechanical properties of the adhesive system and the wafers 104 and 112), the topography of features on the device wafer, and other similar factors. In thinning applications, the processed surface of the device wafer 112 (i.e., the surface with topography) typically faces the adhesive layer 108, and the unprocessed or backside of the device wafer is exposed for thinning. In one embodiment, the thickness of the adhesive layer 108 is sufficient for providing an approximately 10 .mu.m to 15 .mu.m band of adhesive over surface features of the device wafer 112. Example surface features on a device wafer include, but are not limited to, C4 bumps, micro bumps and other electrically active features of a semiconductor device.

Other factors that can influence the thickness of the adhesive layer 108 include the types of layers used in the adhesive layer, the fracture toughness of the layers, the viscosity and surface tension of the adhesive components applied to the wafer, the adhesive application method used, and other similar factors. The adhesive layer preferably provides adhesion that is particularly strong with respect to shear stress applied between the adhesive layer and the wafers 104 and 112 (i.e., in a direction parallel to the adhesive layer) and is not as strong with respect to a normal stress applied to separate the two wafers.

The adhesive layer 108 is applied so that the exposed surface of the device wafer 112 and the exposed surface of the carrier wafer 104 (i.e., the two surfaces that do not contact the adhesive layer) are parallel within, in some examples, approximately 4 .mu.m In other examples, the device wafer 112 and the carrier wafer 104 are parallel to within approximately 1 .mu.m, or to less than 1 .mu.m of total thickness variation across the two wafer stack.

Debonding System

Figure 1B:
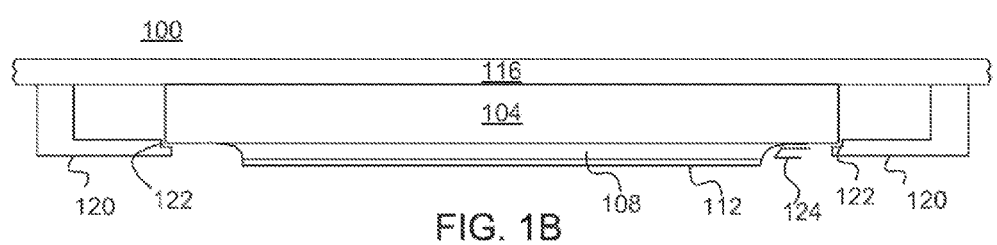
FIG. 1B is a cross-sectional view of a carrier wafer temporarily bonded to a device wafer, further showing a wafer support structure and a holdback device for the carrier wafer, in an embodiment.

FIG. 1B illustrates one high level embodiment of a system 100 used for debonding the carrier wafer 104 from the device wafer 112 by initiating a crack (or craze) at an edge of the adhesive layer 108 proximate to a wafer/adhesive layer interface using a controlled mechanical, chemical, thermal, or radiative perturbation. In addition to the elements introduced in FIG. 1A, the system 100 includes a wafer support structure 116, a holdback device 120, and a crack initiator 124.

The wafer support structure 116 provides structural support for the carrier wafer 104 and/or the wafer stack 104/112. The wafer support structure 116 may also provide a structure to which the holdback device 120 is attached. A second wafer support structure may be used to support the device wafer 112. For clarity, the second wafer support structure is not shown in FIG. 1B. One design is based on the mechanical debonder described in FIGS. 30-41 of U.S. application Ser. No. 13/085,159, which is incorporated herein by reference. The wafer support structure 116 in FIG. 1B is the flex plate (item 253) of the mechanical debonder, and the second wafer support structure (not shown in FIG. 1B) is the porous vacuum chuck (item 256) of the mechanical debonder.

Figure 1C:
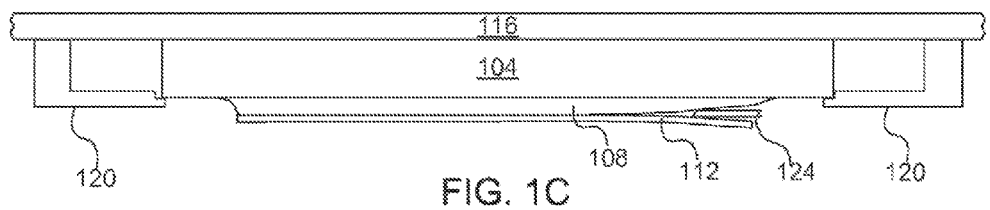
FIG. 1C is a cross-sectional view showing use of a crack initiator to initiate a crack for debonding a carrier wafer and device wafer, in an embodiment.

The crack initiator 124 is used to initiate, and/or propagate, a crack between the adhesive layer 108 and either the carrier wafer 104 or the device wafer 112 starting at an edge of the adhesive layer. This is illustrated in FIG. 1C. The crack is used as part of a controlled debonding process of the wafers 104 and 112.

Figure 1D:
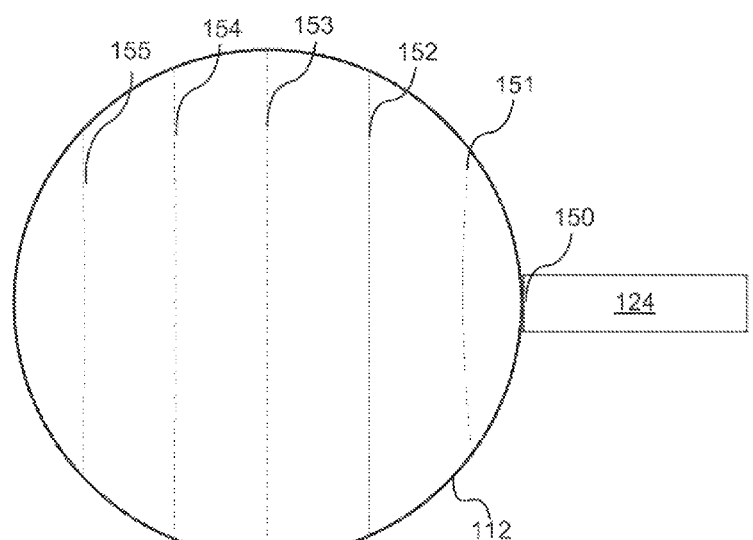
FIG. 1D is a plan view of a crack advancing in a controlled debonding process, in an embodiment.

In a controlled debonding process, the crack advances in a controlled fashion, for example approximately as a line, as shown in FIG. 1D. FIG. 1D shows a plan view (top view) of the device wafer 112. The crack initiator 124 initiates the crack at point 150. The crack then propagates right to left in FIG. 1D. The crack propagation may be the result of normal stress applied to the two wafers to separate them and/or further use of the crack initiator 124. The dashed lines 151-155 show crack propagation over time. Each dashed line represents the leading edge of the crack at a different point in time. For each dashed line, at that point in time, the two wafers are separated to the right of the dashed line and they are still bonded together to the left of the dashed line. In this example, the leading edge of the crack remains substantially straight as the crack propagates. Such a controlled debonding can be achieved by the mechanical debonder described in FIGS. 30-41 of U.S. application Ser. No. 13/085,159, for example.

The crack does not always have to be initiated at the same point. For example, the crack initiator 124 may be positionable to different points along the edge of the adhesive layer. It may be that the crack initiator 124 can be repositioned relative to the wafer stack, or that there are multiple crack initiators at different locations, or that the wafer stack can be repositioned relative to the crack initiator. In one approach, the wafer stack can be rotated relative to the crack initiator, thus allowing the crack initiator to try different locations for crack initiation.

There may also be multiple initiations before actual crack initiation. For example, the crack initiator may engage the same point multiple times before crack initiation, applying more pressure each time or approaching from a different angle or direction. Alternately, the crack initiator may engage multiple different points before crack initiation. In one process, the crack initiator engages and disengages at a point, the wafer stack is rotated slightly, the crack initiator then engages and disengages the new point, and so on until crack initiation.

Figure 1E:
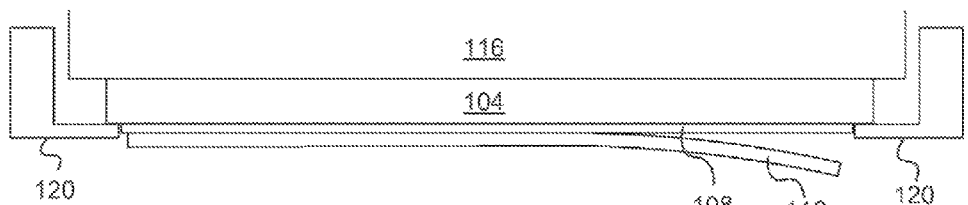
FIG. 1E is a cross-sectional view of a carrier wafer restrained by a holdback device while debonding the device wafer from an adhesive layer, in an embodiment.

Returning to FIG. 1, in some embodiments, the wafer support structure 116 is planar and rigid. For example, if the wafer support structure 116 is a portable chuck that is used to hold the bonded wafers during CMP, then the wafer support structure 116 preferably is planar and rigid. If the same wafer support structure 116 is used during debonding, then the device wafer 112 is "peeled" away from the carrier wafer 104, as shown in FIG. 1E. The crack initiator 124 starts the peeling. The holdback device 120 mechanically restrains the carrier wafer 104 during the debonding process.

Figure 1F:
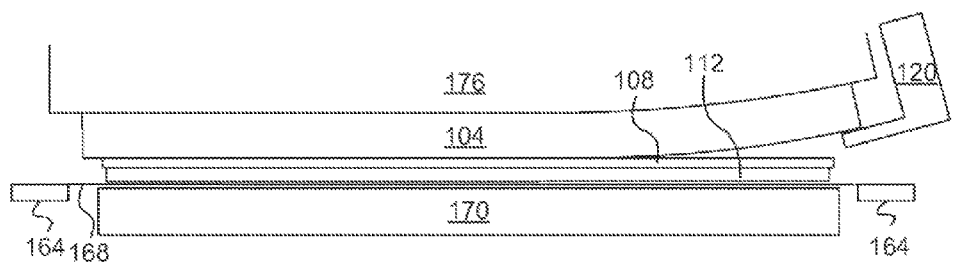
FIG. 1F is a cross-sectional view of a carrier wafer debonded from an adhesive layer using a holdback device, in an embodiment.

While the wafer support structure 116 can be planar and/or rigid, some examples of the wafer support structure are flexible, as shown in FIG. 1F. One example is the mechanical debonder described in FIGS. 30-41 of U.S. application Ser. No. 13/085,159. In that embodiment, the wafer support structure is a flex plate 176. The device wafer 112 is secured by its own chuck 170 (e.g., a porous vacuum chuck, since the device wafer is so thin). The device wafer 112 is debonded onto tape 168 held by tape frame 164.

The flex plate 176 can be used to expose the adhesive layer 108 (or more specifically, an adhesive layer/wafer interface) to the crack initiator 124 by, for example, flexing the carrier wafer 104 away from the device wafer 112. In addition to exposing the adhesive layer 108 by flexing the carrier wafer 104, the flexing of the carrier wafer 104 also exerts an approximately normal stress on the adhesive layer.

This normal stress caused by flexing the carrier wafer 104 via the flex plate 176 can facilitate or initiate crack growth either alone or in combination with the crack initiator 124. Furthermore, using the holdback device 120 and the flex plate 176 to exert a stress on the carrier wafer 104 and the adhesive layer 108, the holdback device can be used to control the propagation of the crack tip so that the carrier wafer is separated from the device wafer 112 in a controlled release.

The holdback device 120 is used to physically secure the carrier wafer 104 to the flex plate 176, thereby providing additional mechanical stability and security to the carrier wafer during separation from the device wafer 112. In this case, the carrier wafer 104 can also be attached to the flex plate via a vacuum, one or more clamps, or other releasable connection. By providing this physical security to the carrier wafer 104, the holdback device 120 helps prevent damage to one or both of the carrier wafer and the device wafer 112 during wafer processing or during separation of the wafers.

The holdback device 120 may also be used to apply a stress to the carrier wafer 104 during separation of the carrier wafer from the device wafer 112. In FIG. 1F for example, the holdback device 120 can apply a stress that is approximately perpendicular to the plane of the carrier wafer 104 that, as described above, flexes the carrier wafer. The resulting strain of the carrier wafer 104 produced by this normal stress can expose the adhesive layer 108 for better access by the crack initiator 124, or can initiate the crack between the adhesive layer and one or both of the wafers 104 and/or 112.

Once the crack is initiated, whether through action of the holdback device 120 or independent from it, a stress applied by the holdback device on the carrier wafer 104 is used to provide a controlled separation of the carrier wafer from the device wafer 112. For example, once the crack is initiated, the propagation of the leading edge of the crack can be controlled by providing controlled continued stress. Once the crack propagates to the target location or interface, the stress and/or the strain rate can be reduced to maintain the trajectory of the crack along the target path.

Figure 1G:
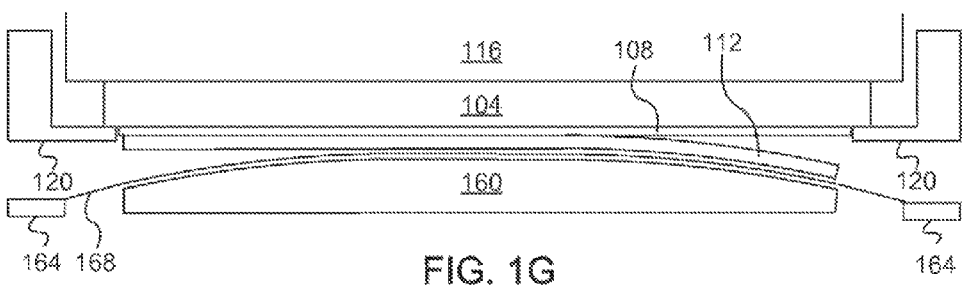
FIG. 1G is a cross-sectional view of a carrier wafer debonded from a device wafer using a beveled wafer support structure, in an embodiment

FIG. 1G shows the use of a beveled wafer support structure 160 for the device wafer 112. In this example, the device wafer 112 is debonded onto tape 168 held by tape frame 164. The beveled shape allows easier access to the edge of the adhesive layer for crack initiation. For example, the wafer stack can be engaged beginning on the right side of the tape 168. It can then be "rocked" from right to left across the beveled surface. This will apply a similar stress as the peeling motion of FIG. 1F.

Figure 2A:
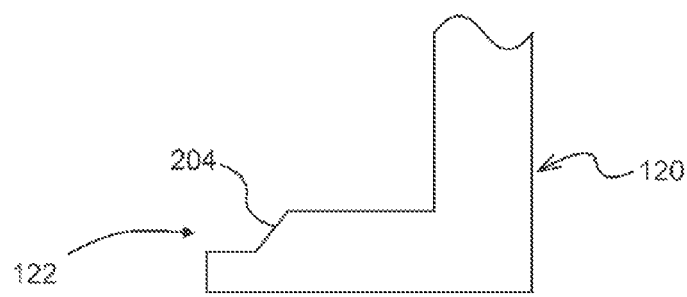
FIGS. 2A-2C are side and plan views of examples of a portion of a holdback device having different shapes, in an embodiment.
Figure 2B:
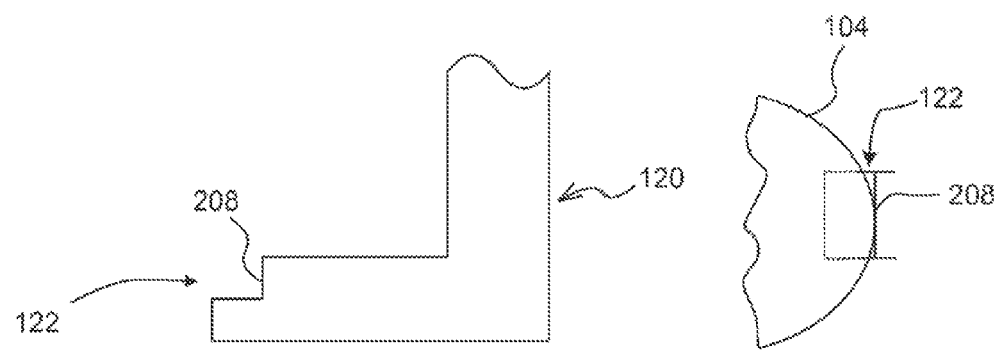
Figure 2C:
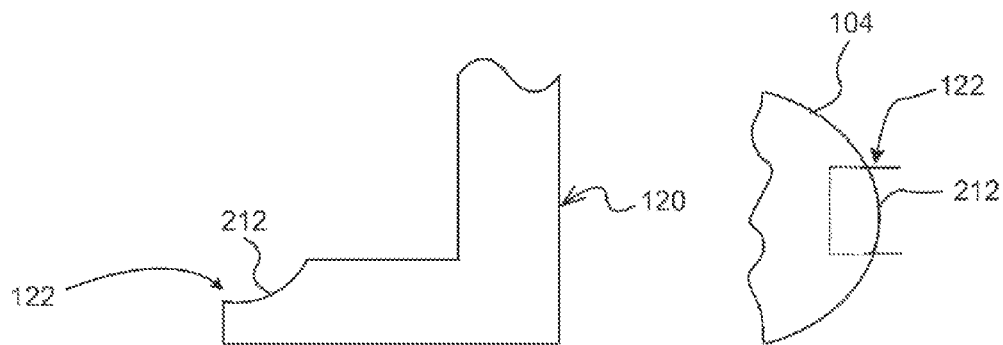
Figure 3A:
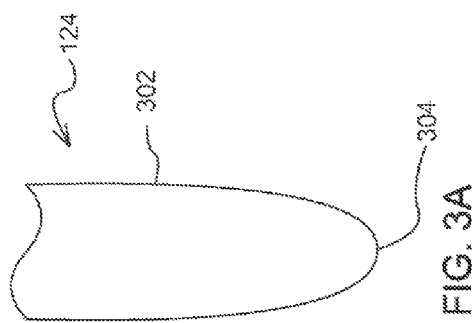
FIGS. 3A-3E are plan views (top views) of example tip configurations of a crack initiator, in an embodiment.
Figure 3B:
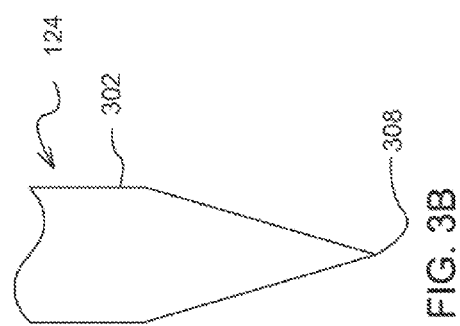
Figure 3C:
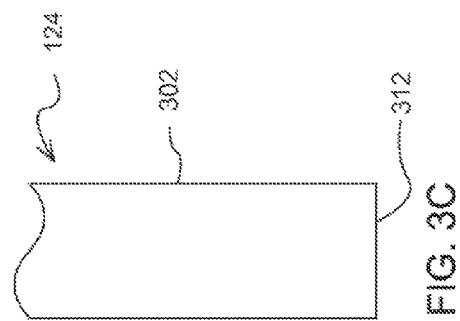
Figure 3D:
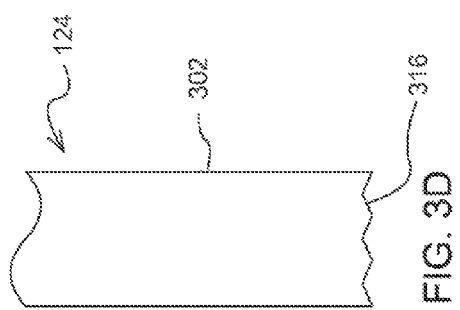
Figure 3E:
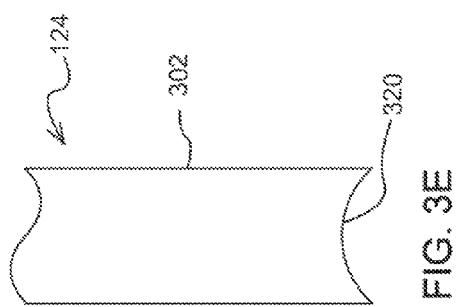

The holdback device 120 includes a wafer contact surface 122 that contacts the carrier wafer 104, thereby securing it or applying a stress or strain to it, as described above. Turning now to FIGS. 2A-2C, the shape of the wafer contact surface 122 can be adapted to the particular structural or mechanical properties of the carrier wafer 104. FIGS. 2B-2C show a plan view in addition to a side cross-sectional view. As shown in FIGS. 2A-2C, the wafer contact surface 122 can include a sloped backstop 204, a stepped backstop 208, or a scalloped backstop 212. These different backstop profiles can be selected according to the amount or type of contact desired with the carrier wafer 104. In the plan view, the holdback device can have a straight backstop (as shown in FIG. 2B) or a curved backstop that conforms to the wafer shape (as shown in FIG. 2C). The conformal backstop has a larger contact area with the carrier wafer 104 at the wafer edge compared to the straight backstop, which may only contact a portion of the perimeter edge of the wafer. These three example backstops are presented only as examples.

Other profiles or backstop shapes of the wafer contact surface 122 are possible and the different plan and side views may be mixed. For example, the stepped backstop 208 of FIG. 2B may be combined with the conformal plan view of FIG. 2C.

Crack Initiator Apparatus

As described above, the crack initiator 124 is used to initiate and/or propagate a crack starting at an edge of the adhesive layer, and preferably located between the adhesive layer 108 and either the carrier wafer 104 or the device wafer 112. The crack is used as part of a controlled debonding process of the wafers 104 and 112. In a controlled debonding process, the leading edge of the crack advances approximately in the shape of a line, as shown in FIG. 1D. The controlled perturbations from the crack initiator 124 can be provided by using, for example, mechanical, thermal, chemical, and/or radiative means. In another aspect, the crack initiator 124 can be used to conduct electrical charge from the device wafer 112, thereby reducing the risk of an electro-static discharge damaging the integrated circuits on the device wafer.

In one example, the crack initiator 124 initiates the crack by simply impinging at an interface between the adhesive layer and either the device wafer 112 or the carrier wafer 104. This mechanically introduces a crack at this interface. This mechanical perturbation can be controlled by the shape of the crack initiator 124 and by controlling the force, velocity, angle of perturbation delivery, location of the perturbation, added types of perturbation (thermal, chemical, etc.), depth of penetration, and/or acceleration of the crack initiator. Different tip configurations are discussed in further detail below.

In examples in which the adhesive layer 108 includes viscoelastic layers or components, the rate at which the crack initiator 124 penetrates the adhesive material layer can influence the initiation, propagation, and characteristics of the crack. For example, if the material(s) used for the adhesive layer 108 are strongly viscoelastic, the crack initiator may introduce a controlled mechanical perturbation at a relatively high velocity and/or acceleration to introduce a crack into the adhesive layer or at the edge of the adhesive layer/wafer interface in the glassy regime of the material. Providing a low velocity and/or low acceleration mechanical perturbation to a highly viscoelastic adhesive layer 108 in this example could either fail to crack the adhesive layer at the interface or create a crack with a blunted crack tip (thus reducing the stress concentration at the crack tip). This in turn can increase the energy needed to propagate the crack, thereby increasing the stresses, and the risk of damage, on the carrier and device wafers 104 and 112.

In another example, the crack initiator 124 can provide a mechanical perturbation at the edge of the adhesive layer 108/wafer 104 or 112 interface using an ultrasonic or megasonic frequency, such as that produced by a piezo-electric transducer. The piezo-electric transducer can be integrated into the crack initiator 124 as a separate device, or a tip of the crack initiator can itself be a piezo-electric transducer that is actuated by a remotely located controller. The ultrasonic mechanical perturbation can facilitate crack initiation by, for example, perturbing the adhesive material in a regime where the material is less ductile or less able to absorb energy provided by the crack initiator 124.

In yet another example, the crack initiator 124 initiates a crack by providing a controlled thermal perturbation to the adhesive layer. In some examples, the crack initiator 124 either conducts heat from a remote heat source or includes a heating element. In either case, the crack initiator 124 can deliver the heat to the adhesive layer, thereby providing a controlled thermal perturbation to the adhesive layer 108 that can be used to initiate a controlled release of the carrier wafer 104 from the device wafer 112. The controlled thermal perturbation can initiate this controlled release of the wafers by, for example, melting a portion of the adhesive layer 108, raising a portion of the adhesive layer above a glass transition temperature of a material used as one or more layers of the adhesive layer, or burning a portion of the adhesive layer.

In still yet another example, rather than introducing a controlled thermal perturbation by heating a portion of the adhesive layer 108, the crack initiator 124 can introduce a controlled thermal perturbation by cooling the adhesive layer using an integrated or remotely located cooling source. In one embodiment of this example, the crack initiator 124 can cool an adhesive layer 108 that includes a viscoelastic material below a glass transition temperature, thereby making the material less compliant and/or reducing its fracture toughness. This chilled portion of the adhesive layer can be cracked more easily compared to the material above its glass transition temperature. Methods of cooling include using the crack initiator 124 to deliver a refrigerant or cryogen (such as an ether, liquid nitrogen or solid carbon dioxide) to the adhesive layer 108 and/or using a remotely cooled crack tip initiator as a head sink to conduct heat from the adhesive layer.

In other embodiments, even a non-viscoelastic material can have a reduced fracture toughness or increased brittleness when sufficiently cooled. In some examples, cooling non-viscoelastic materials used in the adhesive layer 108 reduces elastic modulus, which can increase stress concentration at the crack tip, thereby lowering fracture energy. In still other embodiments, cooling the adhesive layer 108 can be combined with a controlled mechanical perturbation to initiate a crack by increasing the brittleness (or reducing the fracture toughness) of the adhesive layer and then mechanically perturbing it.

In yet another example, the crack initiator 124 initiates a crack by providing a controlled chemical perturbation to the adhesive layer. In one embodiment, the chemical used to provide the perturbation is selected responsive to the components of the adhesive system. That is, the chemical in this embodiment is selected to be a solvent or swelling agent for the adhesive layer 108, or one or more layers within the adhesive layer, such as release layers or primer layers. By providing a chemical that weakens the adhesive properties of the adhesive layer 108 or the structural integrity of the layer (or layers therein), the controlled release of the carrier wafer 104 from the device wafer 112 can be performed by applying a stress or strain to the carrier wafer using the holdback device.

In one embodiment, the controlled chemical perturbation can be delivered using the crack initiator 124 as a conduit for a fluid chemical that is then presented to the adhesive layer 108. The chemical can be drawn into a pre-existing crack by capillary action or by being injected by the crack initiator 124, thereby facilitating crack growth. In another embodiment, the chemical can be provided to or all of the exposed adhesive layer 108 that is roughly concentric with the device wafer 112. This can then weaken the interface around the circumference of the adhesive layer 108, enabling a controlled debonding using the holdback device 120 to exert a stress on the carrier wafer 104, thereby pulling the carrier wafer away from the weakened adhesive.

In still yet another example, the crack initiator 124 can include a radiation delivery device that can be used to irradiate the adhesive layer 108 as part of initiating a crack. The radiation delivered can be selected in combination with the adhesive material used, and can include infrared, visible or ultraviolet radiation (delivered from a source using e.g. an optical fiber), as well as microwave radiation or other frequencies of electromagnetic radiation. In one embodiment, infrared radiation can be used to provide heat energy to the adhesive layer 108 to facilitate debonding. In another embodiment, ultraviolet radiation is provided to the adhesive layer 108 to facilitate chain scission of an optically active adhesive (e.g., polymeric or oligomeric systems including methacrylates), thereby reducing adhesion and reducing the amount of energy needed to separate the carrier wafer 104 from the device wafer 112. As described elsewhere, the delivery of radiation can be combined with other mechanisms for initiating and propagating a crack at the adhesive layer 108.

Crack Imitator Tips

FIGS. 3A-3E are plan views (top views) of a variety of cross-sections of the crack initiator 124, each initiator shown having a different tip. The crack initiator 124 and its tip can be selected based on the fracture properties of the adhesive layer 108 at the wafer interface and/or other crack initiation technique(s) used to initiate and propagate a crack, such as those described above. As shown, the crack initiator includes a shaft 302 that can be connected to a rounded tip 304, a pointed tip 308, a planar tip 312, a serrated tip 316, or a concave arcuate tip 320. The shafts 302 are all shown as the same width in FIGS. 3A-3E, but the widths may also vary. For example, a narrower crack initiator may be used if the purpose is just to initiate the crack. A wider crack initiator may be used if it will also be used to further propagate the crack after initiation.

In one embodiment, the pointed tip 308 can be selected to initiate a crack in, for example, a brittle adhesive layer 108. In another embodiment, the pointed tip 308 can be used to initiate a crack in the adhesive layer in combination with a cooling thermal perturbation that increases the brittleness (or reduces the fracture toughness) of the adhesive layer 108 before or during crack initiation. In another embodiment, the rounded tip 304 can be selected to accommodate, for example, a chemical or radiation delivery system (such as a tube, channel or capillary) that provides a chemical or radiational perturbation to the adhesive layer 108. In still yet another embodiment, the serrated tip 316 can be selected to initiate multiple cracks in the adhesive layer 108. These examples are provided only as illustrations for some of the reasons to select a particular tip shape of the crack initiator 124.

In some examples, the crack initiator 124 is configured to initiate a crack at a target location within the adhesive layer 108. The benefit of this is that, as the diversity of adhesive systems used in the industry increases and/or the number of sub-layers in the adhesive layer 108 increases, introducing a crack in the adhesive layer at a target location can improve the ability to separate the carrier wafer 104 from the device wafer 112 without damaging one or both of the wafers.

For example, it can be beneficial to initiate a crack proximate to the device wafer 112 for cases in which the adhesive layer 108 includes a release layer adjacent to the device wafer. The release layer reduces the energy needed to separate the carrier wafer 104 from the device wafer 112. Reducing the energy of separation can increase the likelihood that the device wafer 112 is separated from the carrier wafer 104 without damage.

Initiating a crack at or near a target location within the adhesive layer 108 can be facilitated by, in some examples, using a crack initiator 124 that is configured to introduce a mechanical, thermal, chemical, or radiative perturbation at or near the target location. A benefit of this is that, for adhesive systems that include a release layer, a perturbation would be more effective for a controlled debonding of the wafers when delivered proximate to the release layer, thereby initiating a crack at or near an interface that needs less energy to debond.

FIGS. 4A-4F are side views of a variety of cross-sections of the crack initiator 124, each initiator shown having a different tip. As shown, the crack initiator includes a shaft 302 that can be connected to a flat tip 404, a wedged tip 408, a pointed tip 412, a concave arcuate tip 416, a rounded tip 420 or a scalloped tip 424. Any of these side view cross sections can be combined with the top view cross sections of FIGS. 3A-3E.

Figure 5A:
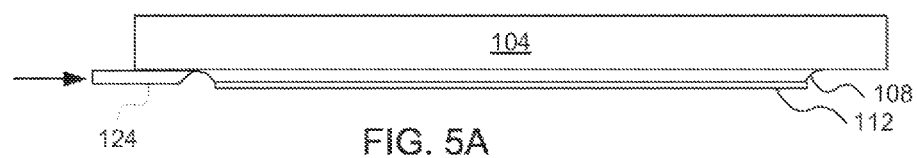
FIGS. 5A-5C are side views illustrating different approaches for engagement of the crack initiator, in an embodiment.

The crack initiator 124 can be used in different ways. In FIG. 5A, a first face of the crack initiator 124 is placed proximate to surface of the carrier wafer 104, thereby placing the wedge-shaped tip proximate to the wafer/adhesive interface. This configuration then delivers the perturbation (whether mechanical, thermal, chemical, radiative, or combinations thereof) at or near the target interface that is intended to be used to separate the carrier wafer 104 from the device wafer 112.

Figure 5B:
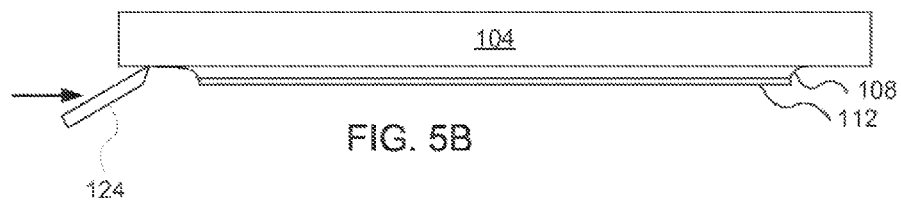

The angle at which the crack initiator 124 is presented to the adhesive layer 108 can also facilitate providing a perturbation proximate to a target location of the adhesive layer. In FIG. 5B, the crack initiator 124 is presented to the adhesive layer 108 at an acute angle with respect to a wafer from which the adhesive layer is to be debonded from. One benefit of this is that the crack initiator 124 can be presented to the adhesive layer free from entanglements with other components of the system, such as a dicing frame, dicing tape, the holdback device, and/or other components of the system.

Figure 5C:
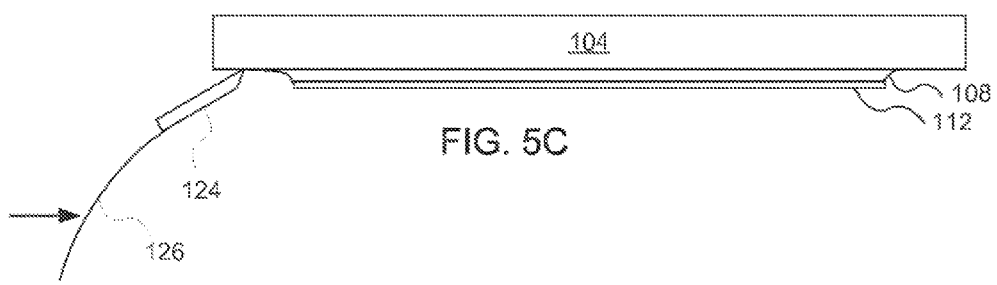

The crack initiator 124 may also be presented to the adhesive layer 108 using a flexible or compliant shaft or other support member. Using a flexible support member has the advantage of allowing the crack initiator 124 to be guided to a target location by other features of the system. In FIG. 5C, the crack initiator 124 can be guided to a wafer/adhesive layer interface by flexing the support member 126 while translating the crack initiator 124 towards the interface. Flexing the support member 126 maintains contact with the carrier wafer until contacting the adhesive layer adjacent to the wafer surface.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

What is claimed is:

1. A method for debonding a device wafer from a carrier wafer, a first side of the carrier wafer temporarily bonded to the device wafer by an adhesive layer, the method comprising:

initiating a crack near an edge of the adhesive layer by applying a perturbation using a crack initiator; and
   applying a controlled force perpendicular to the first side of the carrier wafer, the controlled force flexing the first side of the carrier wafer away from the device wafer to control propagation of the crack, wherein the carrier wafer remains planar during the debonding of the device wafer.

2. The method of claim 1, wherein the controlled force is applied to a perimeter edge of the first side of the carrier wafer.

3. The method of claim 1, wherein the device wafer has a thickness of less than 50 microns.

4. The method of claim 1, wherein the device wafer has a thickness of less than 10 microns.

5. The method of claim 1, wherein a wafer stack comprising the device wafer, the carrier wafer, and the adhesive layer has a total thickness variation of less than 1 micron.

6. The method of claim 1, wherein flexing the carrier wafer away from the device wafer propagates the crack with a substantially straight leading edge.

7. A method for debonding a device wafer from a carrier wafer comprising:
   temporarily bonding a first side of a carrier wafer to a device wafer using an adhesive layer, the device wafer having a thickness of less than 10 microns;
   initiating a crack near an edge of the adhesive layer by applying a perturbation with a crack initiator; and
   applying a controlled force perpendicular to a first side of the carrier wafer, the controlled force flexing the first side of the carrier wafer away from the device wafer to control propagation of the crack, wherein the carrier wafer remains planar during the debonding of the device wafer.

8. The method of claim 7, wherein the controlled force is applied to a perimeter edge of the first side of the carrier wafer.

9. The method of claim 7, wherein the device wafer has a thickness of less than 50 microns.

10. The method of claim 7, wherein the device wafer has a thickness of less than 10 microns.

11. The method of claim 7, wherein a wafer stack comprising the device wafer, the carrier wafer, and the adhesive layer has a total thickness variation of less than 1 micron.

12. The method of claim 7, wherein flexing the carrier wafer away from the device wafer propagates the crack with a substantially straight leading edge.

13. A method for debonding a device wafer from a carrier wafer, a first side of the carrier wafer temporarily bonded to the device wafer by an adhesive layer, the method comprising:
   initiating a crack near an edge of the adhesive layer by applying a perturbation using a crack initiator; contacting the carrier wafer with a holdback device at (1) a circumferential edge of the carrier wafer and at (2) the first side of the carrier wafer; and
   applying, with the holdback device, a controlled force perpendicular to the first side of the carrier wafer, the controlled force flexing the first side of the carrier wafer away from the device wafer to control propagation of the crack, wherein the carrier wafer remains planar during the debonding of the device wafer.

14. The method of claim 13, wherein the controlled force is applied to a perimeter edge of the first side of the carrier wafer.

15. The method of claim 13, wherein the device wafer has a thickness of less than 50 microns.

16. The method of claim 13, wherein the device wafer has a thickness of less than 10 microns.

17. The method of claim 13, wherein a wafer stack comprising the device wafer, the carrier wafer, and the adhesive layer has a total thickness variation of less than 1 micron.

18. The method of claim 13, wherein flexing the carrier wafer away from the device wafer propagates the crack with a substantially straight leading edge.

* * * * *